US006803992B2

(12) United States Patent
Tokuda et al.

(10) Patent No.: US 6,803,992 B2
(45) Date of Patent: Oct. 12, 2004

(54) PROJECTION EXPOSURE APPARATUS

(75) Inventors: Noriaki Tokuda, Kawasaki (JP); Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 72 days.

(21) Appl. No.: 10/098,377

(22) Filed: Mar. 18, 2002

(65) Prior Publication Data

US 2002/0149756 A1 Oct. 17, 2002

Related U.S. Application Data

(62) Division of application No. 09/370,212, filed on Aug. 9, 1999, now Pat. No. 6,388,734, which is a continuation of application No. 09/016,802, filed on Jan. 30, 1998, now abandoned, which is a division of application No. 08/850,817, filed on May 2, 1997, now Pat. No. 5,995,263, which is a continuation of application No. 08/337,519, filed on Nov. 9, 1994, now abandoned.

(30) Foreign Application Priority Data

Nov. 12, 1993 (JP) ............................................. 5-283130
Jun. 3, 1994 (JP) ............................................. 6-122128

(51) Int. Cl.⁷ .......................... G03B 27/42; G03B 27/68
(52) U.S. Cl. .............................. 355/53; 355/52; 355/67
(58) Field of Search ............................. 355/30, 52, 53, 355/68, 67, 71, 77; 356/399, 400, 401; 250/201.1, 201.2, 548; 359/196

(56) References Cited

U.S. PATENT DOCUMENTS 4,998,821 A * 3/1991 Ohta et al. ................. 353/122
5,105,075 A    4/1992 Ohta et al. ................. 250/201.2
5,436,692 A    7/1995 Noguchi ....................... 355/53
5,448,336 A    9/1995 Shiraishi ....................... 355/71
5,677,757 A   10/1997 Taniguchi et al. ............. 355/71
5,721,608 A    2/1998 Taniguchi ..................... 355/53
5,789,734 A    8/1998 Torigoe et al. ........... 250/201.2
5,801,832 A *  9/1998 Van Den Brink ........... 356/500
5,995,263 A   11/1999 Tokuda et al. ............... 359/196
6,018,395 A *  1/2000 Mori et al. .................. 356/401
6,388,733 B1 * 5/2002 Hayashi ....................... 355/53

* cited by examiner

Primary Examiner—Rodney Fuller
(74) Attorney, Agent, or Firm—Miles & Stockbridge P.C.

(57) ABSTRACT

A scan type projection exposure apparatus which includes an illumination optical system for forming a slit-shaped illumination area on a pattern on a mask by using illuminating light, and a projection optical system for forming an image of a portion of the pattern in the illumination area on a substrate, includes: a mask stage which moves at least in one direction while holding the mask; a substrate stage which moves two-dimensionally while holding the substrate; a control system for synchronously scanning the mask stage and the substrate stage; and an image forming performance adjusting system for adjusting image forming performance of the projection optical system and having a component placed in an area through which the illuminating light incident from the illumination area on the mask to the projection optical system does not pass.

39 Claims, 10 Drawing Sheets

SCANNING DIRECTION

FIG. 11A
FIG. 11B
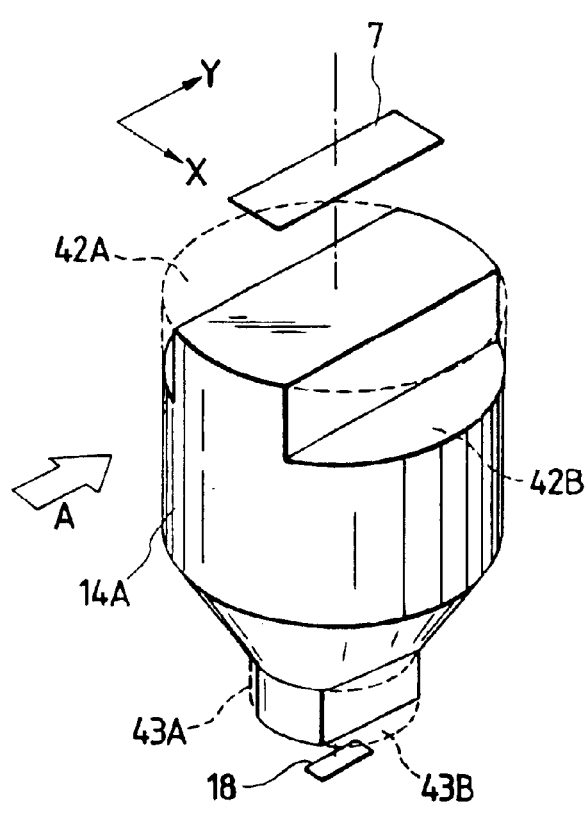
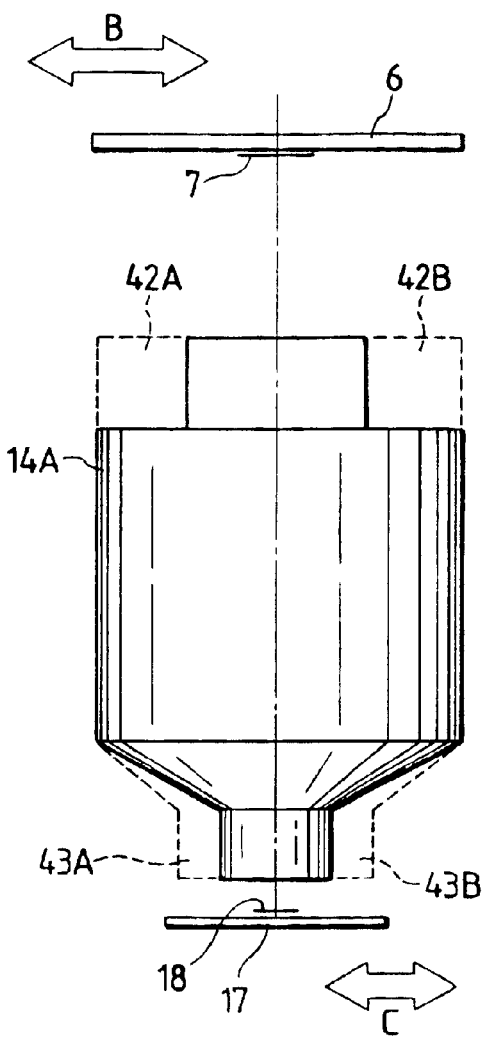

PROJECTION EXPOSURE APPARATUS

CROSS-REFERENCE TO RELATED APPLICATIONS:

This application is a division of Application Ser. No. 09/370,212 filed Aug. 9, 1999, now U.S. Pat. No. 6,388,734 which is a continuation of Application Ser. No. 09/016,802 filed Jan. 30, 1998, now abandoned which is a division of Application Ser. No. 08/850,817 filed May 2, 1997, now U.S. Pat. No. 5,995,263 which is a continuation of Application Ser. No. 08/337,519 filed Nov. 9, 1994 (abandoned).

BACKGROUND OF THE INVENTION

1. Field of the Invention

The present invention relates to a projection exposure apparatus which, for example, is used in the process of manufacturing semiconductor devices. More particularly, it relates to a so-called step-and-scan type projection exposure apparatus for scanning a mask and a photosensitive substrate synchronously in one-dimension at the time each of shot areas on the photosensitive substrate is exposed.

2. Related Background Art

Up to this time, in manufacturing semiconductor devices or liquid crystal display devices, etc. under photolithography technique, projection exposure apparatuses have been utilized in which a pattern formed on a reticle (or a photomask, etc.) is exposed via a projection optical system on a wafer (or a glass plate, etc.) with photoresist or the like applied thereto. In such projection exposure apparatuses, step-and-repeat type (batch exposure type) projection exposure apparatuses have been principally utilized in which a reticle and a wafer are exposed under a stationary state thereof after setting each of shot areas provided on the wafer to the exposure position by stepping actuation of a wafer stage like a stepper.

Generally, with the projection exposure apparatuses, it is required to keep image forming performance of the projection optical system (aberration caused by heat deformation of a lens absorbing exposure light, defocus or the like) within an allowable range, so that a mechanism for adjusting the image forming performance (also including its measurement) is provided. For example, an image forming performance adjusting device is used, which includes a mechanism for adjusting gaseous pressure of hermetically sealed spaces between groups of lenses constituting the projection optical system according to the exposure amount, a mechanism for adjusting a predetermined position or inclined angle of lenses constituting the projection optical system, or the like. Also, an oblique incidence type focal position detecting device or the like is used for measuring a degree of defocus, in which an image of slit-pattern is projected relative to the exposure surface of the wafer so that the focal position of the wafer is measured based on the position of the image formation of the reflected light.

With the recent trend toward increasing the size of a chip pattern of a semiconductor, a projection exposure apparatus is required to expose a larger area of the pattern of the reticle onto the wafer. Therefore, a projection exposure apparatus of a so-called step-and-scan type or a slit scan type (scan type exposure apparatus) has been proposed in which the reticle is illuminated with a rectangular-shaped or circular-shaped illumination area (hereinafter, called the "slit-shaped illumination area") and the reticle and the wafer are synchronously scanned with respect to the projection optical system so as to expose the pattern of the reticle.

Even in such a scan type exposure apparatus, it is required to keep image forming performance of the projection optical system within an allowable range. However, a conventional mechanism for the batch exposure type projection exposure apparatus has still been utilized for adjusting the image forming performance. Also, in the scan type exposure apparatus, although it is required to include an alignment device for positioning each of the shot areas on the reticle and the wafer, and a focus leveling device for positioning the photosensitive substrate in the direction of the optical axis of the projection optical system, the conventional mechanism for the batch exposure type projection exposure apparatus has been similarly utilized for the alignment device and the focus leveling device.

FIG. 14 shows a conventional scan type projection exposure apparatus which includes such a mechanism as a sensor or the like. In FIG. 14, an alignment microscope 27 of through-the-lens type (TTL) is provided in the neighborhood of an upper end of a projection optical system 14 for detecting positions of alignment marks of the respective shot areas on a photosensitive substrate 17 via the projection optical system 14. Also, another alignment microscope 28 is provided in the neighborhood of the lower end of the projection optical system 14 for detecting the alignment marks on the photosensitive substrate 17 according to an off-axis system. The alignment microscopes 27 and 28 position the photosensitive substrate 17.

Then, a through-the-lens type focus leveling sensor (not shown) for positioning the photosensitive substrate 17 in the direction of the optical axis of the projection optical system 14, i.e., for focussing and leveling, or a so-called oblique incidence type focus leveling sensor placed in a space between the projection optical system 14 and photosensitive substrate 17 are provided. FIG. 14 only shows a floodlight system 29 of the oblique incidence type focus leveling sensor. In addition, although the alignment microscope 28 and the floodlight system 29 are practically placed in asymmetric positions relative to the optical axis of the projection optical system 14, they are shown on the same plane in FIG. 14 for convenience.

The sensor for positioning means is required to be out of contact, so that an optical sensor is chiefly used. When performing accurate measurement with such an optical sensor, it is important to avoid air fluctuation of an optical path of probe light as much as possible. For this, an exclusive air conditioning device 130 can be provided between a reticle 6 and the projection optical system 14.

Further, in FIG. 14, an actuator 131 is attached for actuating, for example, a lens element 15 out of lens elements of the projection optical system 14. The position or the inclined angle of the lens element 15 is finely adjusted through the actuator 131 so that some aberrations of the projection optical system 14 are adjusted, thereby obtaining a better projected image.

Lens elements other than the lens element 15 can be actuated by the actuator 131 inside the projection optical system 14.

As described above, in the conventional scan exposure type projection exposure apparatus, the batch exposure type mechanism is utilized for adjusting the image forming performance (including its measurement). Also, the batch exposure type mechanism is utilized as the alignment device for the conventional scan exposure type projection exposure apparatus. However, the scan exposure type projection exposure apparatus tends to make the allowable range more narrow with respect to the image forming performance of the projection optical system being in a stationary state. Accordingly, it has been desirable to provide a more highly accurate mechanism for adjusting the image formation.

Similarly, it has been desirable to improve the alignment mechanism used for the scan exposure type projection exposure apparatus. For the purposes of this specification, the alignment mechanism is to be considered in a broad sense as to constitute a kind of adjusting mechanism for adjusting image forming performance of the projection optical system. Also, an image forming property, such as distortion or curvature of field, is to be considered as a kind of image forming performance.

In the conventional scan type projection exposure apparatus, various mechanisms (an air conditioning mechanism, an alignment mechanism and the like) are mounted around the projection optical system so as to secure very high accuracy. As a result, the mounted mechanisms may mechanically interfere with each other under certain circumstances, which presents a problem in that the system can be difficult to design or install, or in that a desired performance cannot be obtained because of an unreasonable arrangement.

SUMMARY OF THE INVENTION

In consideration of such problems, it is an object of the present invention is to provide a scan type exposure apparatus which can adjust (or measure) image forming performance of a projection optical system with a mechanism suitable for the scan exposure system.

The above-mentioned object can be attained, according to the present invention, by a scan type exposure apparatus including a mask stage which moves at least in one direction while holding a mask; a substrate stage which moves two-dimensionally while holding a substrate; a control system for synchronously scanning the mask stage and the substrate stage; and an image forming performance adjusting system for adjusting image forming performance of the projection optical system and having a component placed in an area as not to be passed by the illuminating light incident from the illumination area on the mask to the projection optical system.

According to another aspect of the present invention, a scan type exposure apparatus includes a mask stage which moves at least in one direction while holding a mask; a substrate stage which moves two-dimensionally while holding a substrate; a control system for synchronously scanning the mask stage and the substrate stage; and an actuating means which arranges a plurality of optical property correcting members, respectively having properties different from each other, at least in one of a space between a mask side lens of the projection optical system and the mask or a space between a substrate side lens of the projection optical system and the substrate so as to correct an image forming property of the projection optical system, and which arranges one of the plurality of optical property correcting members in an optical path of the illuminating light in accordance with the imageforming property of the projection optical system.

Also, another object of the present invention is to provide a projection exposure apparatus which is provided with a projection optical system suitable for projection exposure in a scan system and which enables effective arrangement of associated mechanisms, such as alignment microscopes necessary to position a photosensitive substrate or focus leveling sensors, utilizing the projection optical system.

In order to accomplish the above-mentioned object, the present invention provides a scan type exposure apparatus including a mask stage which moves at least in one direction while holding a mask; a substrate stage which moves two-dimensionally while holding a substrate; a control system for synchronously scanning the mask stage and the substrate stage; and lens elements of the projection optical system that are shaped so as to exclude lens portions through which image forming luminous flux of the pattern image does not pass.

BRIEF DESCRIPTION OF THE DRAWINGS

FIG. 11A is a perspective view showing a projection optical system 14A of FIG. 8;

FIG. 11B is a side view which is seen in the direction of an arrow A of FIG. 11A;

DETAILED DESCRIPTION OF THE PREFERRED EMBODIMENTS

Referring now to FIGS. 1 to 6, a scan type exposure apparatus according to the first embodiment of the present invention will be described hereinbelow. The embodiment applies the present invention to a step-and-scan type projection exposure apparatus.

Figure 1:
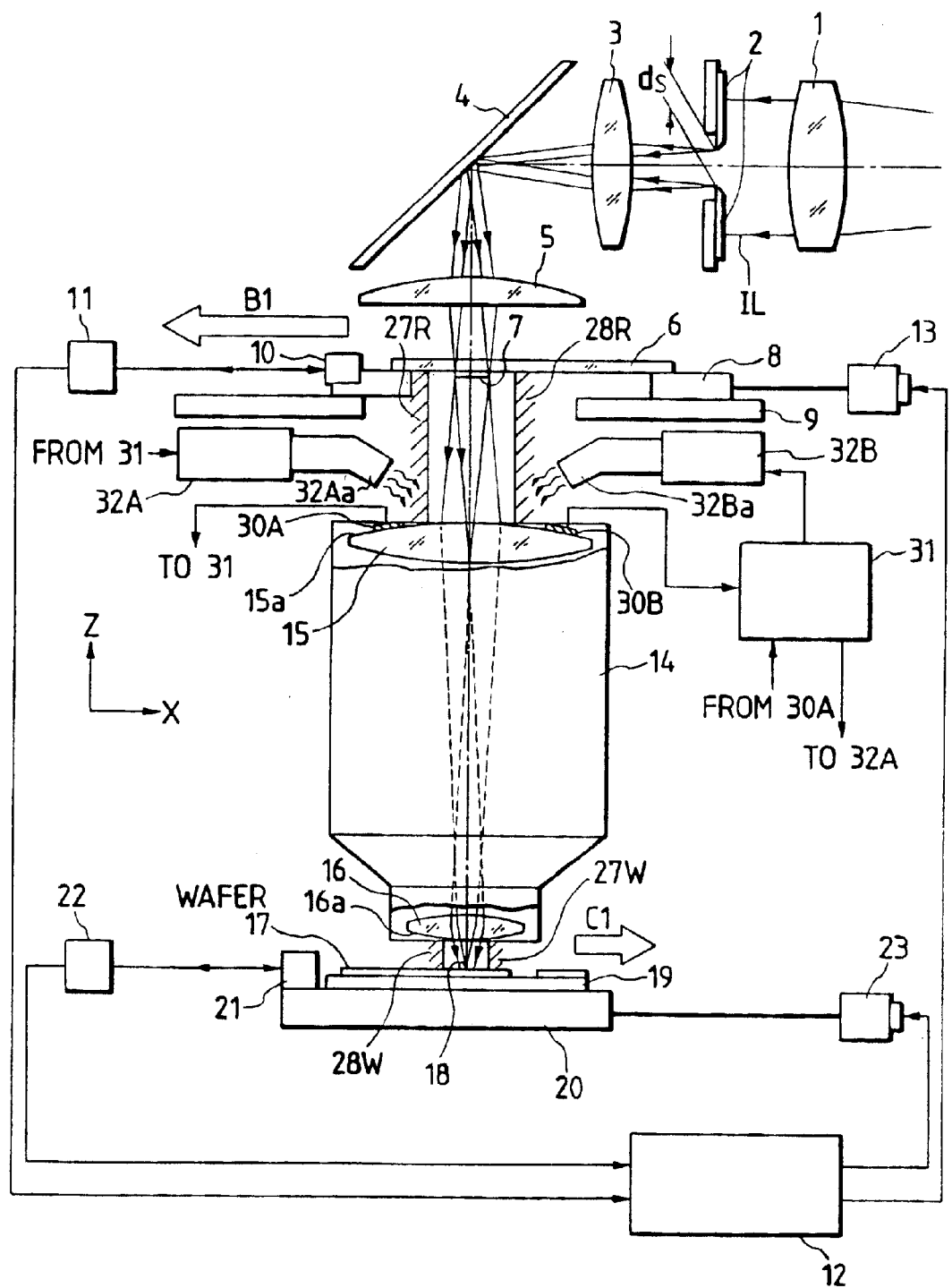
FIG. 1 is a partially broken away view showing a structure of a projection exposure apparatus according to a first embodiment of the present invention.

FIG. 1 shows a schematic structure of the projection exposure apparatus according to the embodiment. In FIG. 1, illuminating light (exposure light) IL consisting of i ray (wavelength 365 nm) from an unillustrated optical integrator in an illumination optical system, e.g., from a mercury lamp, illuminates a field stop 2 via a first relay lens 1. Here, KrF excimer laser light (wavelength 248 nm), etc. can be used for the illuminating light IL.

Then, the illuminating light that passes through a slit-shaped aperture of the field stop 2 illuminates a slit-shaped illumination area 7 on a reticle 6 with uniform luminous intensity via a mirror 4 for bending an optical path and an illumination condenser lens 5. The field stop 2 is arranged at a plane conjugate with the pattern formed on a surface of the reticle 6, so that the projected image of a rectangular-shaped aperture portion having a width $d_E$ of the short side direction formed in the field stop 2 corresponds to the slit-shaped illumination area 7.

The reticle 6 is placed on a reticle base 9 via a movable reticle stage 8, and coordinate information of scan direction of the reticle stage 8 is sent to a main control system 12. The coordinate information is measured by a movable mirror 10 fixed to the end portion on the reticle stage 8 and a laser interferometer 11 placed outside. The main control system controls scan speed and scan position of the reticle stage 8 via a reticle actuating device 13. In the embodiment, although a linear motor is used for the actuating mechanism of the reticle stage 8, a screw type actuating mechanism may be used therefor.

The image pattern in the silt-shaped illumination area 7 formed on the reticle 6 is projected through the projection optical system 14 of both sides telecentric type (or one side telecentric type) so as to form an image thereof inside a slit-shaped exposure area 18 on the wafer 17 to which photoresist is applied. In other words, the exposure area 18 is conjugate with the illumination area 7, i.e., with the aperture portion of the field stop 2. Also, the projection optical system 14 is constituted by putting a lens 15 at the reticle 6 side and a lens 16 at the wafer 17 side in a lens-barrel. Here, Z-axis is parallel to the optical axis of the projection optical system 14, X-axis is in a vertical surface relative to the Z-axis and is parallel to the paper surface of FIG. 1, and Y-axis is vertical relative to the paper surface of FIG. 1. The direction parallel to the X-axis is the scan direction of the reticle 6 and the wafer 17.

Figure 2:
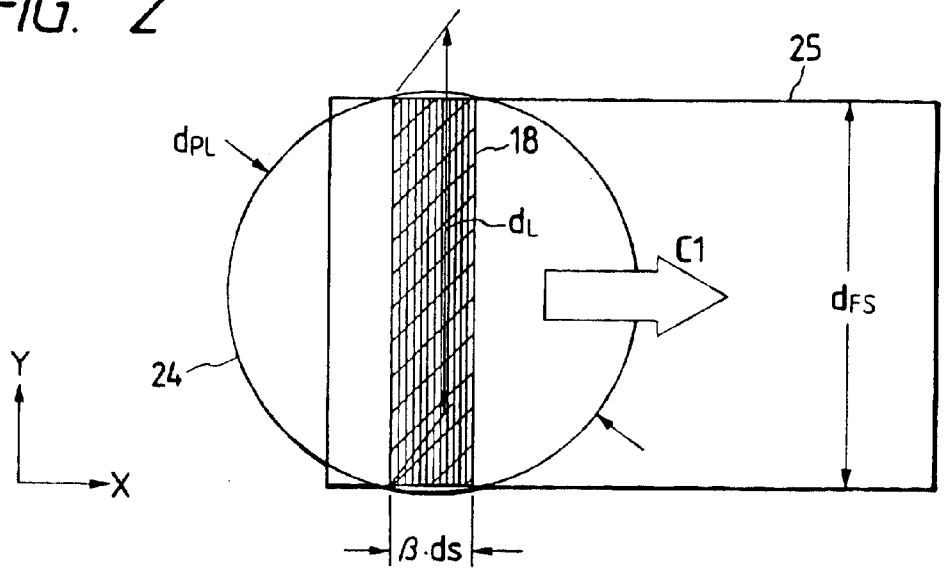
FIG. 2 is an enlarged plan view showing a slit-shaped exposure area of FIG. 1.

FIG. 2 shows the slit-shaped exposure area 18 on the wafer 17 shown in FIG. 1. In FIG. 2, the slit-shaped exposure area 18 is set so as to be substantially inscribed in a circular-shaped effective exposure field 24 which has a diameter $d_{PL}$ and which is formed by the projection optical system 14. Therefore, the width $d_L$ of the long side of the slit-shaped exposure area 18 on the exposure surface of the wafer is substantially equal to the diameter $d_{PL}$ of the effective exposure field 24. Here, in the case the projection magnification of the projection optical system 14 of FIG. 1 is set to β and the magnification from the field stop 2 to the reticle 6 is set to 1, the width of the short side direction of the exposure area 18 of FIG. 2 is substantially expressed by $\beta \cdot d_S$ using the width $d_S$ of the short side direction of the rectangular-shaped aperture portion of the field stop 2.

In the process of exposure, an exposure field (shot area) 25 having a width $d_{FS}$ ($\simeq d_L$) of the short side direction on the wafer is scanned along the short side direction of the exposure area 18, e.g., in a C1 direction (−X direction) in FIG. 2, and the reticle is scanned in the reverse side direction (+X direction), so that the image pattern of the reticle 6 is projected so as to be exposed onto the exposure field 25. In this case, since the width $d_L$ of the long side direction of the slit-shaped exposure area 18 is equal to the width $d_{FS}$ of the short side direction of the exposure field 25, a larger exposure field can be obtained in comparison with a batch-type exposure, because the size of the exposure field is determined by the diameter $d_{PL}$ of the effective exposure field of the projection optical system, even using the same sized projection optical system.

Continuing with the embodiment being discussed by returning to FIG. 1, the wafer 17 is placed on a movable wafer stage 20 via a wafer holder 19 and a two-dimensional coordinate on the wafer stage 20 is sent to the main control system 12, which is measured by a movable mirror 21 fixed onto the wafer stage and a laser interferometer 22 placed outside. The main control system 12 controls positioning operation and scan operation of the wafer stage 20 via a wafer actuating device 23. Although a linear motor is used for the actuating mechanism of the wafer stage 20, a screw type actuating mechanism may be used therefor. In the process of scan type exposure, for example, the wafer stage 20 is scanned with velocity $V_W$ ($=\beta \cdot V_R$) in the C1 direction under control of the main control system 12 at the same time the reticle stage 8 is scanned with velocity $V_R$ in the B1 direction, so that the image pattern of the reticle 6 is projected so as to be exposed onto the wafer 17.

Figure 3:
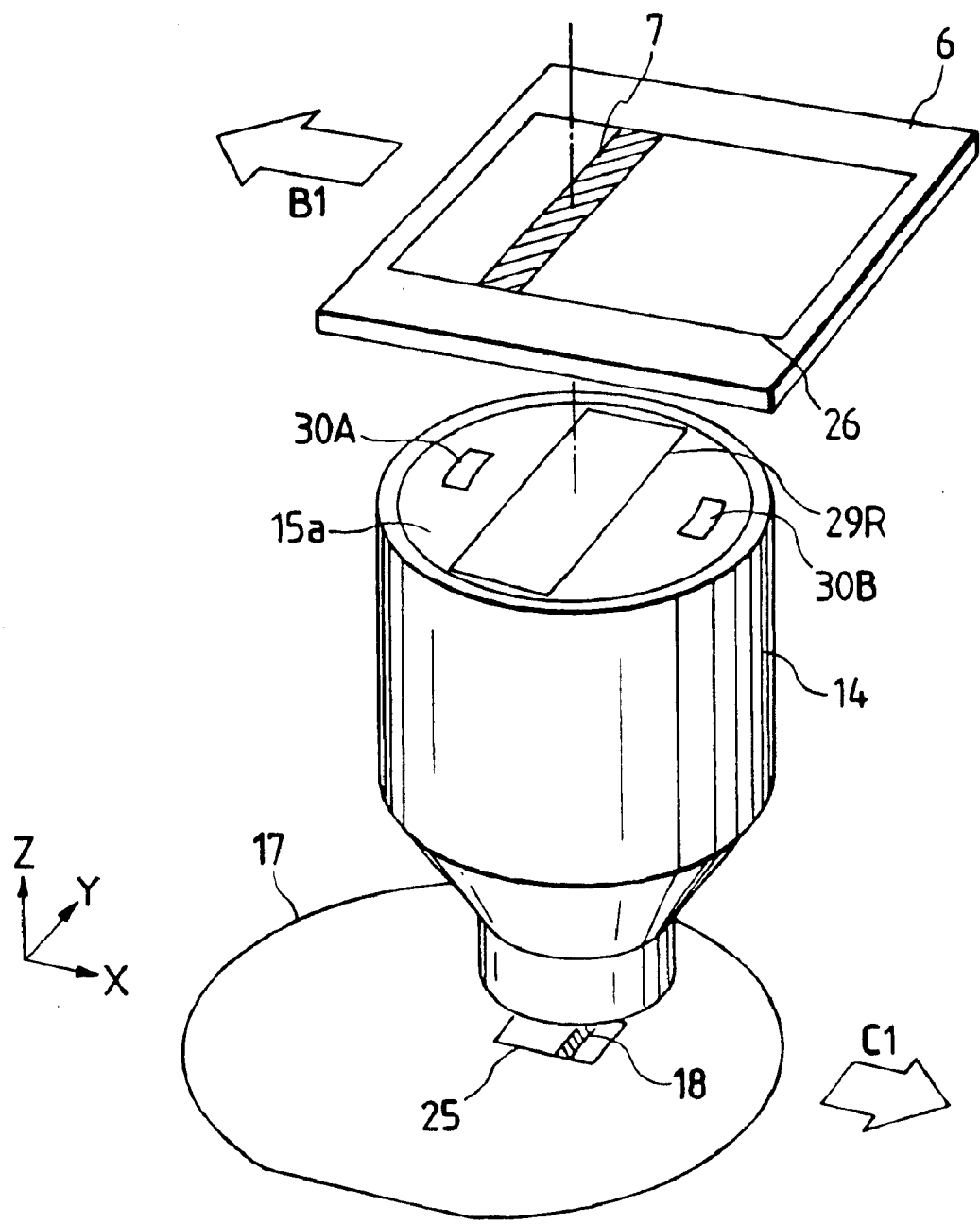
FIG. 3 is a perspective view explaining a case of exposure in a scan exposure system according to the first embodiment.

FIG. 3 is a perspective view showing a state of synchronous scan mentioned above. In FIG. 3, the exposure field 25 on the wafer 17 is scanned in the C1 direction (+X direction) relative to the hatched exposure area 18 at the same time a pattern area 26 of the reticle 6 is scanned in the B1 direction (−X direction) relative to the shadowed slit-shaped illumination area 7. Conversely, the wafer 17 can be scanned in the −X direction at the same time the reticle 6 is scanned in the +X direction. Thus, the image pattern in the pattern area 26 of the reticle 6 is projected so as to be exposed onto the exposure field 25.

Further, continuing with the embodiment being discussed by returning to FIG. 1, in the projection exposure apparatus of the embodiment, the illumination area 7 on the reticle 6 forms into a slit shape having its short side in the scan direction (X direction). For this reason, an area through which the illuminating light IL passes from the illumination area 7 up to the projection optical system 14 is the area to the inside of areas 27R and 28R drawn by hatched lines in the scan direction (X direction) (hereinafter, called the "non-illumination areas"). The non-illumination areas 27R and 28R are extended so as to contact with the surface 15a at a fairly thick portion of the lens 15 placed nearest to the reticle side of the projection optical system 14.

Similarly, a passing area of the illuminating light from the projection optical system 14 up to the wafer 17 is the area to the inside of non-illumination areas 27W and 28W drawn by hatched lines in the scan direction. The non-illumination areas 27W and 28W are extended so as to contact with the surface 16a at a fairly thick portion of the lens 16 placed nearest to the wafer side of the projection optical system 14. In FIG. 1, although only two lenses provided at the ends of the projection optical system 14 are shown, many other lenses are practically placed therebetween. In those lenses, as the lens is nearer to the reticle 6 or the wafer 17, the non-illumination areas become larger. Moreover, as the lens is nearer to the pupil plane of the projection optical system 14 (Fourier transform surface relative to the reticle 6), the illuminating light expands over a wider range.

In order to effectively utilize the non-illumination areas 27R and 28R between the projection optical system 14 and the reticle 6, according to the present invention, both portions on the surface 15a of the lens 15, which are contact with the non-illumination areas 27R and 28R, are respectively covered with thermistors 30A and 30B.

Next, the thermistors 30A and 30B are connected with a temperature measuring portion in an image forming property correcting system 31 so as to detect an actual temperature of the lens 15 in the temperature measuring portion. Then, the detected temperature is sent to a control portion provided in the image forming property correcting system 31. In addition, thermocouples, platinum electrodes or the like can be used instead of the thermistors 30A and 30B.

As shown in FIG. 3, on the surface 15a of the lens 15 of the reticle 6 side in the projection optical system 14, the thermistors 30A and 30B are fixed outside in the scan direction relative to an illumination area 29R of the illuminating light that passes through the illumination area 7. Accordingly, the thermistors 30A and 30B can accurately measure the actual temperature of the lens of the reticle 6 side and do not intercept the illuminating light, so that the image pattern of the reticle 6 can be accurately exposed onto the wafer 17.

Further, continuing with the embodiment being discussed by returning to FIG. 1, air blowing units 32A and 32B are placed in the bottom surface side of the reticle base 9 so as to be opposite to each other along the scan direction. One air outlet 32Aa of the air blowing unit 32A and the other air outlet 32Ba of the air blowing unit 32B are respectively placed in the non-illumination areas 27R and 28R. Devices are used for the air blowing units 32A and 32B, which, for example, are branched from an air conditioning mechanism for a chamber of the projection exposure apparatus of the present invention and which adjust a flow rate of gas. The temperature of the gas was already adjusted (e.g., cooled up to a predetermined temperature) therein, so that the devices blow the gas respectively from the air outlets 32Aa and 32Ba to maintain an adjusted temperature on the surface of the lens 15. The control portion in the image forming property correcting system 31 controls the flow rate of the gas in the air blowing units 32A and 32B.

The control portion of the image forming property correcting system 31 controls the flow rate of gas that is blown onto the surface of the lens 15 from the air blowing units 32A and 32B through the respective air outlets 32Aa and 32Ba so as to keep the temperature of the lens 15 measured by the thermistors 30A and 30B within a predetermined temperature range. Therefore, even when exposing for a long time, exposure energy from the illuminating light is not accumulated, so that heat deformation of the lens 15 becomes small, thus keeping the image forming property proper in the projection optical system.

Also, in FIG. 1, a cooling mechanism may be provided in the non-illumination areas 27W and 28W of the wafer 17 side for cooling the lens 16 of the wafer 17 side.

Next, referring to FIGS. 4, 5A and 5B, the second embodiment of the present invention will be described. Since mechanisms of a stage system and a projection optical system in a projection exposure apparatus which is utilized in this embodiment are the same as those of the projection exposure apparatus of FIG. 1, description of the stage system will be omitted and the projection optical system will be described briefly.

Figure 4:
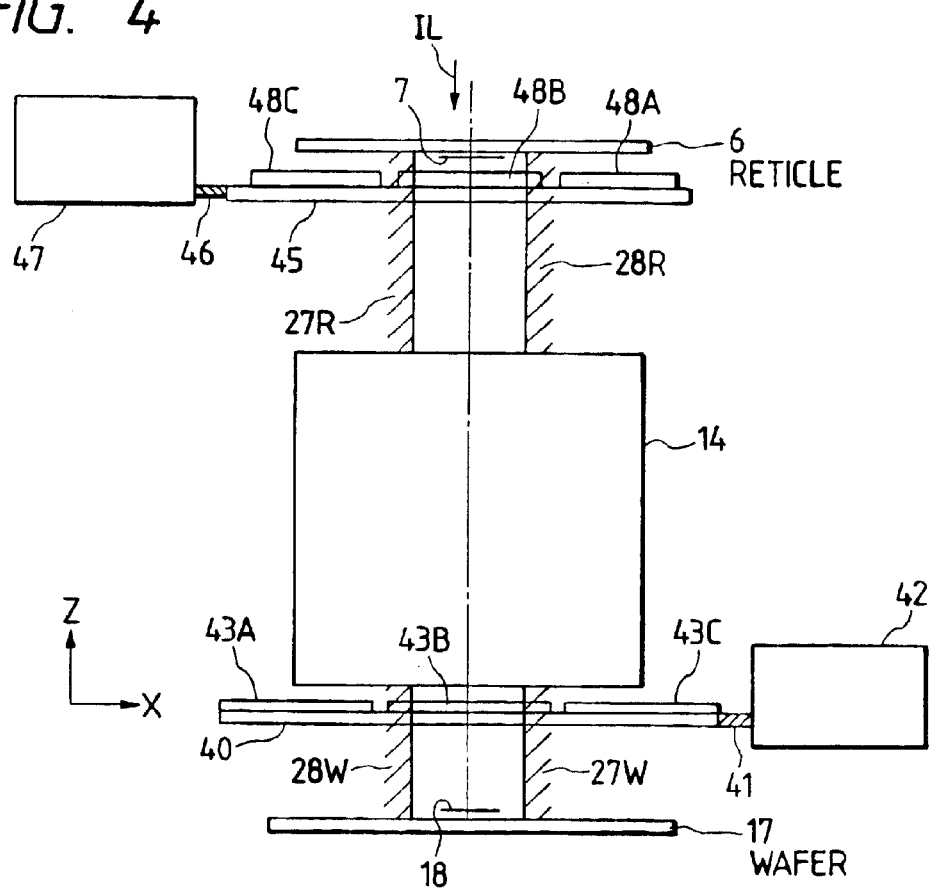
FIG. 4 is a schematic diagram showing a structure from a reticle 6 up to a wafer 17 according to a second embodiment of the present invention.

FIG. 4 shows a structure of an optical system with associated mechanisms which is provided between the reticle 6 and the wafer 17. In FIG. 4, a stage 45 is placed between the reticle 6 and the projection optical system 14 and supported by an actuating device 47 through an actuating shaft 46 so as to move in the scan direction (X direction). Also, three kinds of distortion correcting members 48A to 48C are placed on the stage 45 along the scan direction. Such distortion correcting members 48A to 48C correct distortions respectively different in an image to be projected by the projection optical system 14.

Further, each of the distortion correcting members 48A to 48C has a space enabling it to completely receive the illuminating light from the slit-shaped illumination area 7 on the reticle 6. Furthermore, any of the distortion correcting members 48A to 48C can be set under the bottom of the illumination area 7 by moving the stage 45. In a state of FIG. 4, the distortion correcting member 48B located in the center is placed under the bottom of the slit-shaped illumination area 7 of the reticle 6, while other distortion correcting members 48A and 48C respectively are sheltered in the non-illumination areas 28R and 27R.

Recently, there has been proposed a modified-light-source type of illumination, which utilizes a plurality of apertures decentered from the optical axis, and a method of ring-shaped illumination in the illumination optical system. By these techniques, the distortion property can be changed by changing the illumination condition. When the present embodiment is employed in such a system, one of the distortion correcting members 48A to 48C that makes the distortion error smallest for a particular illumination condition is set under the bottom of the illumination area 7 by moving the stage 45 via the actuating device 47. Also, because the width of the scan direction (X direction) of the illumination area 7 is narrow, the non-selected distortion correcting members can be sheltered by utilizing the non-illumination areas 27R and 28R, whereby the apparatus can be more compact.

Also in FIG. 4, a stage 40 is placed between the wafer 17 and the projection optical system 14 and supported by an actuating device 42 via an actuating shaft 41 so as to move in the scan direction (X direction). Further, three kinds of curved image surface correcting members 43A to 43C are placed on the stage 40 along the scan direction. Such curved image surface correcting members 43A to 43C correct curved image surfaces respectively different in an image to be projected by the projection optical system 14.

Each of the curved image surface correcting members 43A to 43C has a space enabling it to completely receive the illuminating light that reaches the slit-shaped exposure area 18 on the wafer 17. Then, any of the curved image surface correcting members 43A to 43C can be set over the top of the exposure area 18 by moving the stage 40. In a state of FIG. 4, the curved image surface correcting member 43B located in the center is placed over the top of the slit-shaped exposure area 18, while other curved image surface correcting members 43A and 43C respectively are sheltered in the non-illumination areas 28W and 27W.

With the occurrence of the above-mentioned change in the illumination condition, a fluctuation in the atmospheric pressure, or heat deformation of the projection optical system 14 caused by illumination light absorption, the curved image surface property can be changed accordingly. More particularly, One of the curved image surface correcting members 43A to 43C that makes the curved image surface smallest is set over the top of the exposure area 18 by moving the stage 40 via the actuating device 42. In this case, non-selected curved image surface correcting members can be sheltered by utilizing the non-illumination areas 27W and 28W, whereby the apparatus can be more compact.

Figure 5A:
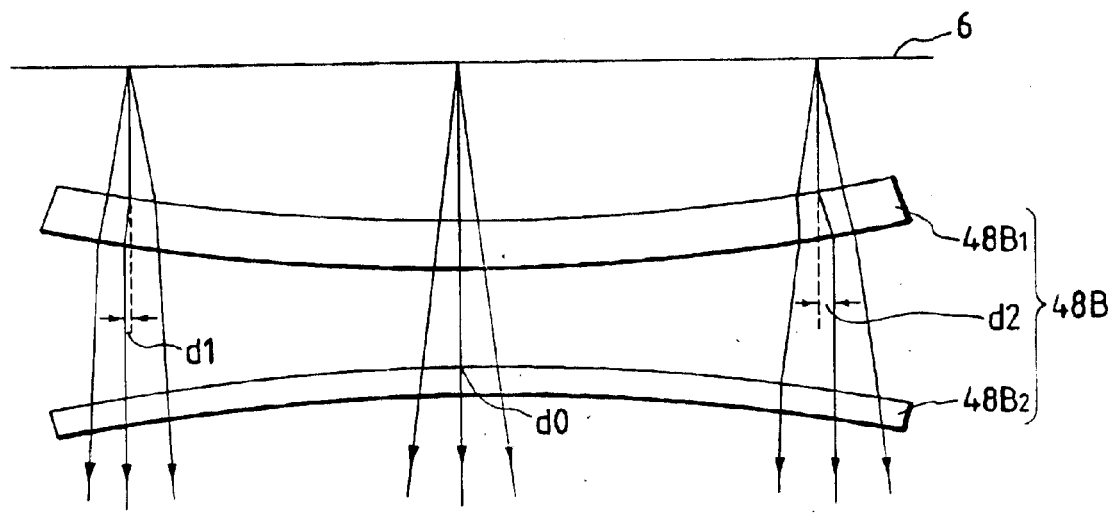
FIG. 5A is an enlarged diagram showing an example of a distortion correcting member 48B shown in FIG. 4.

FIG. 5A shows an example of a structure of the distortion correcting member 48B shown in FIG. 4. In FIG. 5A, the distortion correcting member 48B is constituted of a first parallel flat plate $48B_1$ which is relatively thick and curved, and a second parallel flat plate $48B_2$ which is placed to be opposite to the first parallel flat plate $48B_1$ and which is relatively thin and curved in the reverse sense with respect to the first parallel flat plate $48B_1$.

Generally, in the projection optical system 14, a predetermined distortion will occur as a residual error from the process of planning or as a manufacturing error. Also, such a distortion can change according to the illumination condition or the like. Accordingly, after measuring the distortion property for every illumination condition, the first parallel flat plate $48B_1$ is formed in which the thickness thereof is uniform and the curve (inclination) varies with position by grinding the parallel flat plate, respectively giving side shifts of approximately $d_0$, $d_1$, $d_2$ . . . with respect to main beams of the illuminating light at every position. As a result, the beams of light shift in the side direction with only a certain amount of an image corresponding to the image on the wafer, thereby correcting its distortion.

Further, astigmatism occurring in the first parallel flat plate $48B_1$ is corrected by the second parallel flat plate $48B_2$ which is relatively thin and has a curve property opposite to that of the first parallel flat plate $48B_1$, thus correcting only its distortion.

Figure 5B:
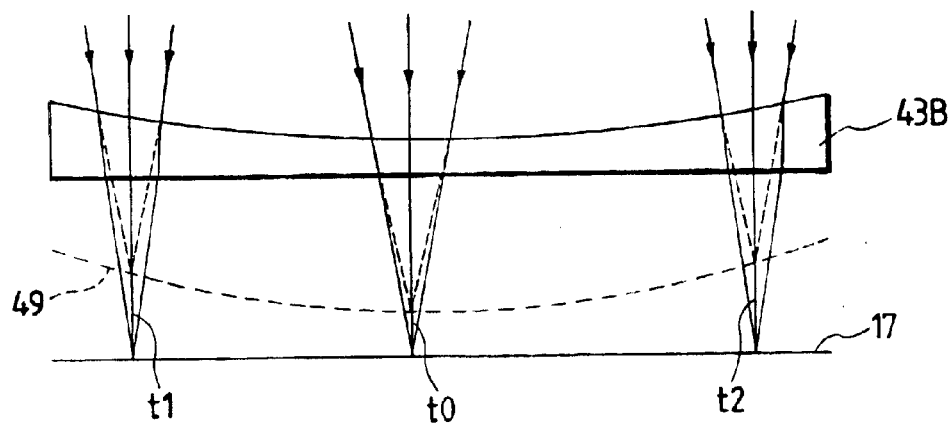
FIG. 5B is an enlarged diagram showing an example of a curved image surface correcting member 43B shown in FIG. 4.

Next, FIG. 5B shows an example of a structure of the curved image surface correcting member 43B shown in FIG. 4. In FIG. 5B, the curved image surface correcting 43B is constituted of a glass plate in which the thickness thereof varies with position. The curvature of field in the projection optical system 14 also occurs because of a manufacturing error or a change in the illumination condition. Accordingly, the curved image surface correcting member 43B is also formed in which the thickness thereof varies with position by grinding a parallel flat glass plate after measuring the curvature property of the image surface in the projection optical system 14.

Then, when an image formation surface 49, for example, is curved so as to be convex relative to the wafer 17 without curved image surface correcting member 43B, the curved image surface correcting member 43B is made thin in the center thereof. As a result, the refractive index of the curved image surface correcting member 43B is larger than that of the air layer, so that the positions of the image formation surface after correction are respectively reduced in the distance of approximately $t_0$, $t_1$, $t_2$ . . . relative to the image formation surface 49 before correction according to thickness distribution in each position, thus correcting the curvature of field. Here, in the case when the numerical aperture of the projection optical system 14 is basically small, the distortion can be properly corrected by using the distortion correcting members 48A to 48C. On the other hand, in the case when the numerical aperture of the projection optical system 14 is basically large, the curvature of field can be properly corrected by using the curved image surface correcting members 43A to 43C. That is, both the distortion and the curvature of field can be properly corrected in the structure shown in FIG. 4.

Next, referring to FIG. 6, the third embodiment of the present invention will be described. This embodiment applies the present invention to a focal position detecting system. Here, mechanisms of a stage system and a projection optical system in a projection exposure apparatus which is utilized in this embodiment are the same as those of the projection exposure apparatus of FIG. 1, so that description of the stage system will be omitted below and the projection optical system will be described briefly.

Figure 6:
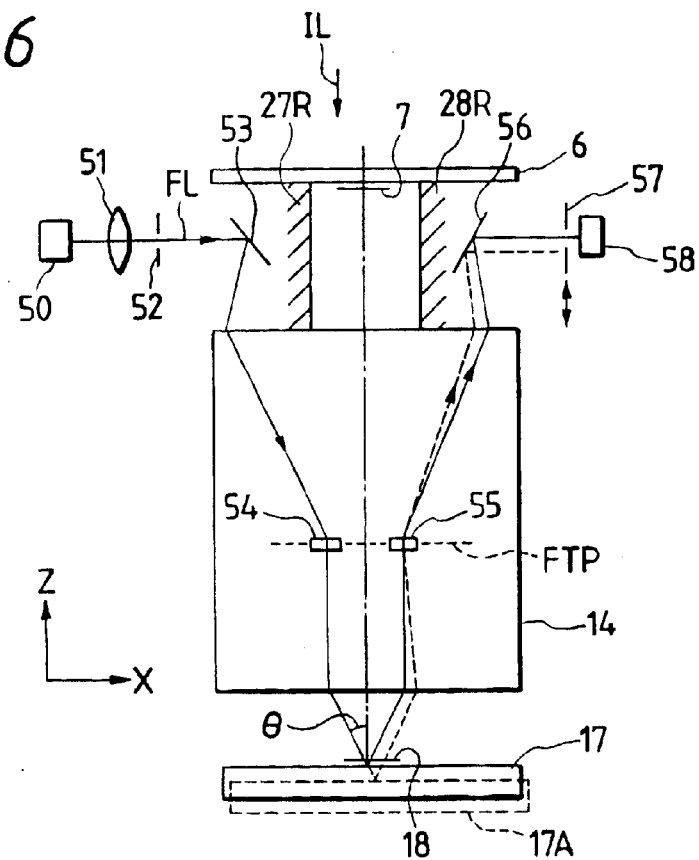
FIG. 6 is a schematic diagram showing a structure of a focal position detecting system according to a third embodiment of the present invention.

FIG. 6 shows a structure of an optical system and the focal position detecting system which are provided between the reticle 6 and the wafer 17. In FIG. 6, deflecting mirrors 53 and 56 are placed so as to be oppositely oriented along the scan direction (X direction) in the non-illumination areas 27R and 28R between the reticle 6 and the projection optical system 14. Also, as shown by only main beams of light for convenience, a detecting light FL emitted from a light source 50 for focal position detection is converged on a slit plate 52 by light converging lens 51 and goes to the projection optical system 14, being reflected by the deflecting mirror 53 after passing through the slit of the slit plate 52.

In this case, the detecting light FL can be a beam of light that is in a wavelength band of low photosensitivity relative to the photoresist on the wafer 17, such as a He—Ne laser beam or the like. Therefore, the projection optical system 14 generally has chromatic aberration in the length and width side directions with respect to the detecting light FL. What is more, measuring points on the wafer 17 that are to be irradiated by the detecting light FL lie in the slit-shaped exposure area 18. Accordingly, such a mechanism as to deflect the optical path of the detecting light is required, so that, in the embodiment, deflecting members 54 and 55, being constituted out of phase type diffraction gratings, are placed near the pupil plane FTP (Fourier transform plane relative to the reticle 6) of the projection optical system 14.

Thus, the optical path of the detecting light FL incident to the projection optical system 14 is deflected (diffracted) near the pupil plane FTP by the deflecting member 54. Then, the detecting light FL irradiated from the projection optical system 14 is incident onto the wafer 17 obliquely at an incident angle (incident angle of main beams) e and projects the slit image on the wafer 17. The light reflected from the wafer 17 returns to the projection optical system 14 in opposition to the process of incidence and reaches to the deflecting member 55 adjacent to the pupil plane FTP. The reflected light of which the optical path is deflected (diffracted) by the deflecting member 55 is reflected by the deflecting mirror 56 after being radiated from the projection optical system 14 and re-focuses the slit image on the vibration slit plate 57. The reflected light passing through the slit on the vibration slit plate 57 is transformed to an electric signal by a photoelectric detector 58.

Since the detecting light FL is incident onto the wafer 17 at the incident angle θ, when the wafer 17 is displaced in the direction of the optical axis (Z direction) of the projection optical system 14 so as to reach a position 17A, a main beam of light reflected from the wafer 17 shifts in the side direction on the vibration slit plate 57 as shown by the dotted line. Then, the detected signal in the photoelectric detector 58 is synchronously detected based on an actuating signal of the vibration slit plate 57, so that a focus signal can be obtained according to the position of the Z direction of the wafer 17. Accordingly, auto-focus is performed with the TTL (through-the-lens) system by adjusting the height of the wafer 17 via an unillustrated Z stage so as to make the focus signal be a predetermined value.

In the embodiment, since the deflecting mirrors 53 and 56 are placed in the non-illumination areas 27R and 28R, the non-illumination areas 27R and 28R are effectively utilized. Also, there is room to place other optical systems in the non-illumination areas 27R and 28R, so that it is possible to place an optical system in the non-illumination areas 27R and 28R for correcting the chromatic aberration of the projection optical system 14 relative to the detecting light FL. Further, other reflecting mirrors may be placed in the non-illumination areas 27R and 28R for detecting positions of the Z direction relative to other measuring points on the wafer 17. Thus, the focal position can be easily measured at many points on the wafer 17 and its leveling can be also performed based on such measurement.

Next, referring to FIG. 7, the fourth embodiment of the present invention will be described. This embodiment applies the present invention to an alignment system which is a TTL system and two luminous flux interference system (hereinafter also called the "LIA system") of the projection exposure apparatus. Here, mechanisms of a stage system and a projection optical system in a projection exposure apparatus which is utilized in this embodiment are the same as those of the projection exposure apparatus of FIG. 1, so that description of the stage system will be omitted below and the projection optical system will be described briefly.

Figure 7:
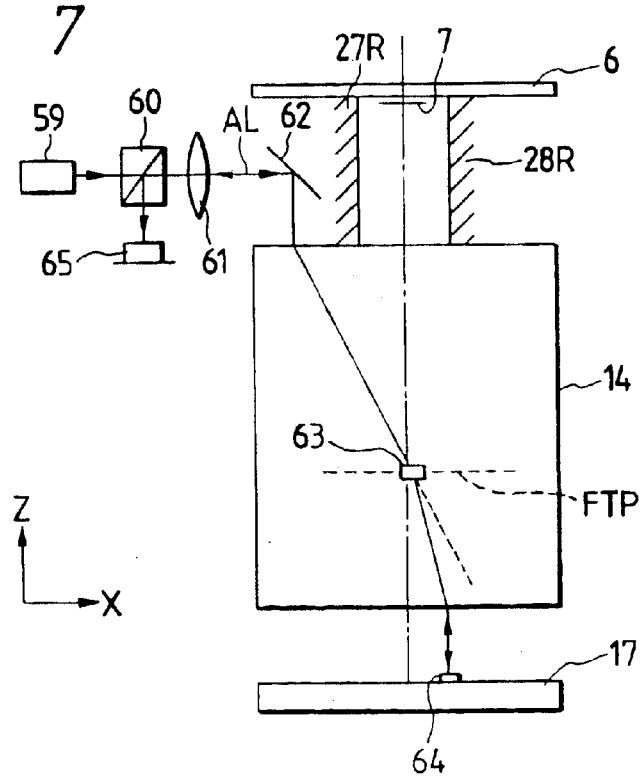
FIG. 7 is a schematic diagram showing a structure of an alignment system according to a fourth embodiment of the present invention.

FIG. 7 shows the optical system and the alignment system which are provided between the reticle 6 and the wafer 17. In FIG. 7, a deflecting mirror 62 is placed in the non-illumination area 27R of the +X direction side relative to the scan direction (X direction) between the reticle 6 and the projection optical system 14. Then, a laser beam AL including two beams emitted from a light source 59 for alignment which are slightly different in frequency from each other goes to the projection optical system 14 via an objective lens 61 and a deflecting mirror 62 after passing through a beam splitter 60.

In this case, the laser beam AL can use a beam of light that is in a wavelength band of low photosensitivity relative to the photoresist on the wafer 17, such as a He—Ne laser beam or the like. Therefore, the projection optical system 14 generally has chromatic aberration in the length and width side directions with respect to the laser beam AL. What is more, a diffraction grating shaped alignment mark (wafer mark) 64 on the wafer 17 that is to be irradiated by the laser beam AL lies in an area far away from the slit-shaped exposure area 18. Accordingly, a mechanism to deflect the optical path of the laser beam AL is required. In the illustrative embodiment, three deflecting members, represented collectively at 63, are constituted of phase type diffraction gratings placed near the pupil plane FTP of the projection optical system 14.

The optical path of the laser beam AL incident to the projection optical system 14 is deflected (diffracted) near the pupil plane FTP by two deflecting members 63. The two beams of the laser beam AL emitted from the projection optical system 14 are incident onto the wafer 17 so as to intersect each other at a predetermined crossing angle. Then, in the case when the wafer mark 64 lies at incident positions of those beams, ± primary diffracting light (heterodyne beam) from the wafer mark 64 is emitted from the wafer mark 64 parallel to the upward vertical direction thereof. The optical path of the heterodyne beam is deflected by the third deflecting member 63 in the projection optical system 14 and the heterodyne beam is returned to the deflecting mirror 62.

Then, the heterodyne beam reflected by the deflecting mirror 62 is incident to the photoelectric detector 65 by being reflected in the beam splitter 60 via the objective lens 61. The photoelectric detector 65 outputs such a beat signal as to change its phase according to the position of the wafer mark 64, thereby detecting the position of the wafer mark 64 based on the beat signal.

Also in the embodiment, since the deflecting mirror 62 is placed in the non-illumination area 27R, the non-illumination area 27R is effectively utilized. Further, there is substantial room to place other optical systems in the non-illumination areas 27R and 28R, so that other deflecting mirrors for detecting positions of a plurality of other wafer marks, an optical system for position detection and the like can be easily placed in the non-illumination areas 27R and 28R, thus detecting positions of the plurality of wafer marks (e.g., five points or more) on the wafer 17 in the process of scan exposure. In this regard, the non-illumination areas of the conventional batch exposure type apparatus are narrow, so that the number of wafer marks that can be detected in the process of exposure has been limited to approximately 2 to 4.

In addition, although the embodiment of FIG. 7 applies the present invention to the two luminous flux interference type alignment system, the present invention is not limited thereto and can be applied to a laser step alignment system (LSA system), in which the positions are detected by scanning wafer marks constituted of dotted lines with a slit-shaped spot light, an image pick-up type alignment system or the like.

Further, although the example of FIG. 7 is a TTL type alignment system, a TTR (through-the-reticle) type alignment system, for example, may be constituted in which a lens for aberration correction with respect to the alignment light is fixed in one of the non-illumination areas between the reticle 6 and the projection optical system 14 and synchronously detects the alignment marks (reticle marks) on the reticle 6 and the wafer marks on the wafer 17 from the upper side of the reticle 6.

Although the foregoing embodiments effectively utilize the non-illumination areas which do not pass the illumination light therethrough, the scan exposure type projection exposure apparatus also has a relatively wide space in an area far away from the pupil plane FTP inside the projection optical system 14, and which does not pass the illuminating light therethrough. Therefore, the thermistors 30A and 30B for temperature measurement or the like may be placed in the space which does not pass the illumination light therethrough inside the projection optical system.

Furthermore, the non-illumination areas 27R, 28R, 27W and 28W, as shown by hatched lines in FIG. 1, and the area that does not pass the illumination light inside the projection optical system 14 do not require strict accuracy of the lenses. Therefore, it is possible to use a highly accurate and expensive nitric material for passing areas of the illuminating light and a relatively lower accuracy (but, having the same thermal expansivity) and inexpensive nitric material for non-passing areas of the illuminating light in the process of grinding the lenses. Then, the nitric materials are ground after being joined to each other, thus reducing the manufacturing cost of lens.

The scan type exposure apparatuses according to the foregoing embodiments have the advantage of being able to perform the adjustment (or measurement) of image forming performance while effectively utilizing non-passing areas of the exposure light. Accordingly, the accuracy of image forming performance of the scan type exposure apparatus and the throughput in the process of exposure can be improved while reducing the manufacturing cost.

Further, when the image forming property correcting system 31 includes thermistors for measuring the temperature of lenses in the projection optical system and an air conditioning mechanism for adjusting the temperature of lenses in the projection optical system, a temperature increase of the lenses in the projection optical system, which is caused by the exposing light absorption, can be controlled, thereby keeping the image forming performance in a predetermined state inside the projection optical system.

In the case when the image forming property correcting system 31 is provided with a mirror which is for bending the optical path and which is placed between the projection optical system and the reticle, the alignment of the substrate can be performed by using the mirror for bending the optical path.

In the case where the image forming property correcting system 31 is provided with first and second mirrors which are for bending the optical path and which are placed between the projection optical system and the reticle, the focal position of the substrate can be detected with a high accuracy by the TTL system.

Furthermore, according to the scan type exposure apparatus of FIGS. 6 and 7, the distortion, the curvature of field or the like with respect to the projection optical system can be reduced for a variety of conditions.

Next, referring to FIGS. 8 to 13, the fifth embodiment of the present invention will be described. In FIGS. 8 to 13, elements corresponding to those of FIG. 1 use the same numerals, so a detailed description thereof will be omitted.

Figure 8:
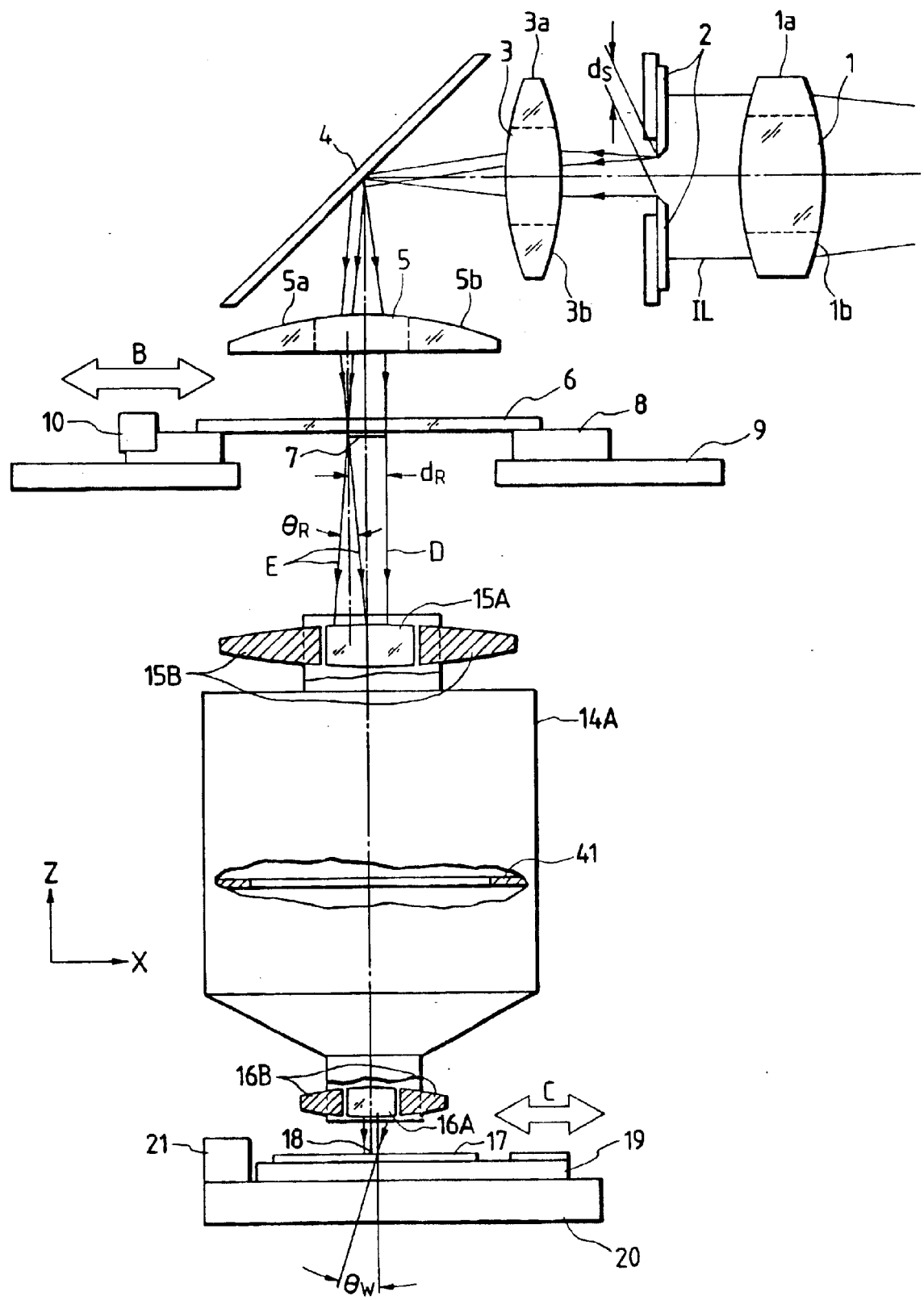
FIG. 8 is a partially broken away view showing a structure of a detailed portion of an optical system and stage systems according to a fifth embodiment of the present invention.

FIG. 8 shows details of an optical system and a stage system of a projection exposure apparatus according to this embodiment. In FIG. 8, an image to be projected of a rectangular-shaped aperture having a width $d_S$ in the short side direction thereof in the field stop 2 forms a slit-shaped illumination area 7 having a width $d_R$ in the short side direction thereof on the reticle 6. A projection optical system 14A according to the embodiment is placed below the bottom side of the reticle 6 and an image conjugate with the illumination area 7 is formed as the slit-shaped exposure area 18 on the photosensitive substrate 17 by the projection optical system 14A. The Z-axis is parallel to the optical axis of the projection optical system 14A, the X-axis is in a perpendicular plane relative to the optical axis of the projection optical system 14A and is parallel to the paper surface of FIG. 8, and the Y-axis is perpendicular to the paper surface of FIG. 8. In this case, the short side direction of the illumination area 7 is a direction parallel to the X-axis. In the process of exposure with the scan system, the reticle 6 is scanned in the B direction parallel to the X-axis with respect to the illumination area 7 and the photosensitive substrate 17 is scanned in the C direction parallel to the X-axis with respect to the exposure area 18.

In the embodiment, only the projection optical system 14A is different in the structure from that of the projection exposure apparatus of FIG. 1, so that the projection optical system 14A will be described in detail below.

In FIG. 8, luminous flux components D and E, which pass along both ends of the slit-shaped illumination area 7 having the width $d_R$ in the short side direction, are shown. The luminous flux component D passing along the right end of the illumination area 7 indicates only luminous flux which is vertically incident to the reticle 6, and the luminous flux component E passing along the left end of the illumination area 7 indicates luminous flux which has the largest inclined angle of all the luminous flux obliquely incident to the reticle 6.

Here, the numerical aperture (NA) of the projection optical system 14A is determined by an aperture stop 41 fixed inside. When a value of the numerical aperture in the photosensitive substrate 17 side is represented by $NA_W$, another value thereof in the reticle 6 side is represented by $NA_R$, and the projection magnification (reduced projection in FIG. 8) of the projection optical system 14A is represented by $\beta$ ($\beta<1$), the following relationship is made.

$$NA_W \times \beta = NA_R \tag{1}$$

Also, in FIG. 8, when the largest open angle of the luminous flux which was emitted from the reticle 6 and is supposed to pass through the aperture of the aperture stop 41 is represented by $\theta_R$, and the largest open angle of the luminous flux which passes through the aperture of the aperture stop 41 is represented by $\theta_W$, the open angles $\theta_W$ and $\theta_R$ are respectively defined by using the numerical apertures $NA_W$ and $NA_R$ as follows:

$$NA_W = \sin \theta_W \tag{2A}$$

$$NA_R = \sin \theta_R \tag{2B}$$

At this time, in the X direction corresponding to the short side direction of the illumination area 7, luminous flux outside the open angle $\theta_R$ out of all luminous flux emitted from the slit-shaped illumination area 7 on the reticle 6 is blocked by the aperture stop 41 of the projection optical system 14A so as not to take part in the projection exposure, while luminous flux outside the open angle $\theta_W$ out of all luminous flux emitted from the projection optical system 14A is not incident to the slit-shaped exposure area 18. Accordingly, in the lens elements constituting the projection optical system 14A, a lens element 15A nearest to the reticle 6 side can be constituted of a member which has removed symmetrically therefrom the hatched portions 15B unnecessary for projection exposure. Similarly, a lens element 16A nearest to the photosensitive substrate 17 can be constituted of a member which has removed symmetrically therefrom the hatched portions 16B unnecessary for projection exposure. Also, in a few lens elements (not shown) adjacent to the lens elements 15A and 16A, although it varies with the design of the projection optical system, portions that do not take part in the projection exposure may be omitted, similarly to those of lens elements 15A and 16A.

On the other hand, in the long side direction of the slit-shaped illumination area 7, each of the lens elements constituting the projection optical system 14A is used over its diameter.

Figure 9:
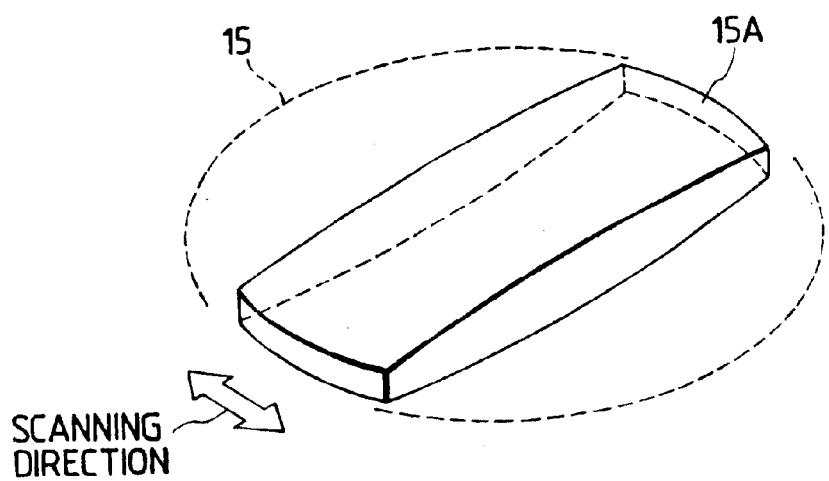
FIG. 9 is a perspective view showing a shape of a lens element 15A of FIG. 8.
Figure 10A:
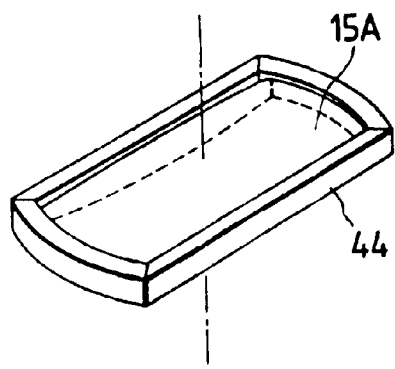
FIG. 10A is a perspective view showing an example of a metallic frame for the lens element 15A of FIG. 8.
Figure 10B:
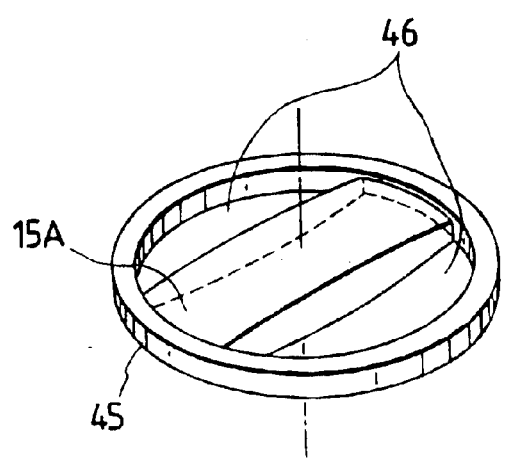
FIG. 10B is a perspective view showing another example of a metallic frame for the lens element 15A of FIG. 8.

Accordingly, in the scan type projection exposure apparatus, it is understood that the shape of the lens element 15A, as shown in FIGS. 9, 10A and 10B, is satisfied with the shape cutting both end portions apart from the axially symmetric lens 15 in the scan direction. The case of the lens element 16A is also the same as that of the lens element 15A. Thus, in the embodiment, lenses having a shape cutting both end portions along the scan direction apart from the lenses, in symmetry, are used for not only the lens elements 15A and 16A but also lens elements adjacent to the lens elements 15A and 16A, if possible.

In addition, a general lens element uses a metallic frame as a holder for accommodating the lens element in a metallic lens-barrel of the projection optical system. In the case of the lens element 15A (similarly, also the lens element 16A) cutting both end portions apart therefrom as mentioned in the embodiment, a metallic frame 44 having substantially rectangular shape and omitting portions corresponding to the unnecessary lens portions, as shown in FIG. 10A, can be used. in another example of the metallic frame, as shown in FIG. 10B, the lens element 15A is held in the circular-shaped metallic frame 45 so as to leave spaces 46 beside both end portions of the lens element 15A, thereby allowing placement of various kinds of mechanisms in the spaces 46 as will be discussed later. The case of using the circular-shaped metallic frame 45 is basically the same as the case of using the substantially rectangular-shaped metallic frame 44 in the sense that the spaces beside the ends of the lens are provided.

In FIG. 8, the substantially rectangular-shaped metallic frame from FIG. 10A is used for the metallic frames of the lens elements 15A and 16A.

FIG. 11A is a perspective view of the projection optical system of FIG. 8 and FIG. 11B is a side view which is seen in the direction of an arrow A of FIG. 11A. As shown in FIGS. 11A and 11B, both side portions of the metallic lens-barrel of the projection optical system are eliminated along the scan direction (B direction) in the illumination area 7 side so as to form spaces 42A and 42B. Also, in the exposure 18 side, both end portions of the projection optical system 14A according to the embodiment are eliminated along the scan direction (C direction) in comparison with the projection optical system 14 of FIG. 1 so as to form spaces 43A and 43B. Thus, in the embodiment, various mechanisms can be placed in such spaces 42A, 42B, 43A and 43B formed by eliminating the above-mentioned structural members.

Figure 12:
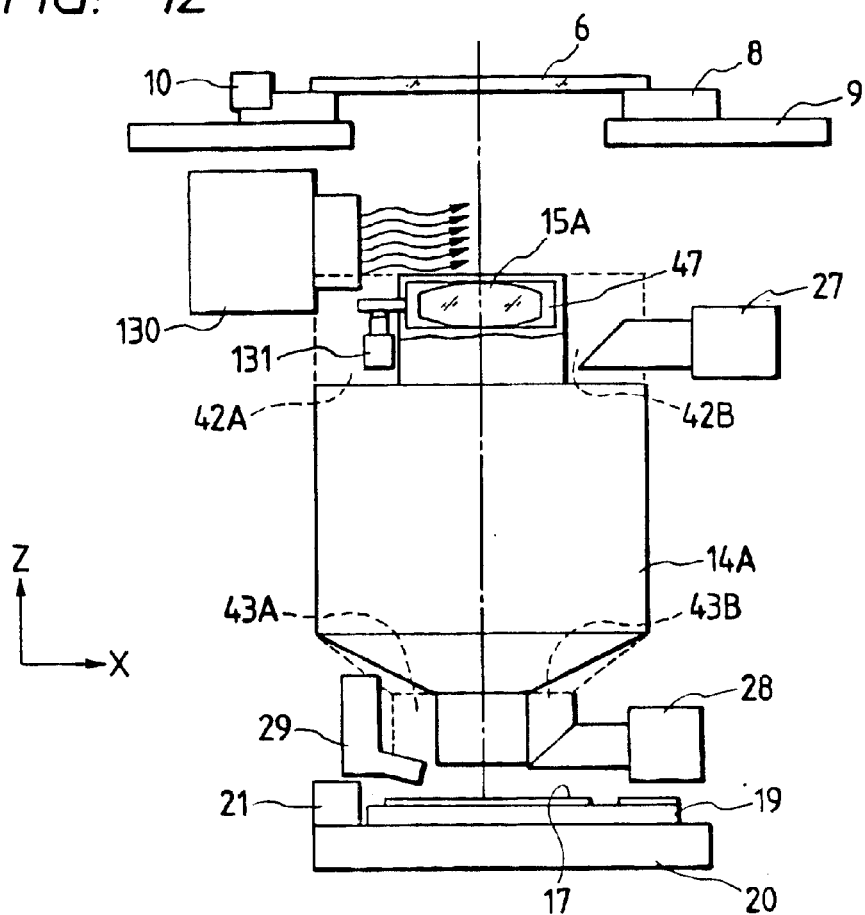
FIG. 12 is a partially broken away view showing a structure of portions of the projection exposure apparatus of FIG. 8, which is provided with various associated mechanisms.
Figure 13:
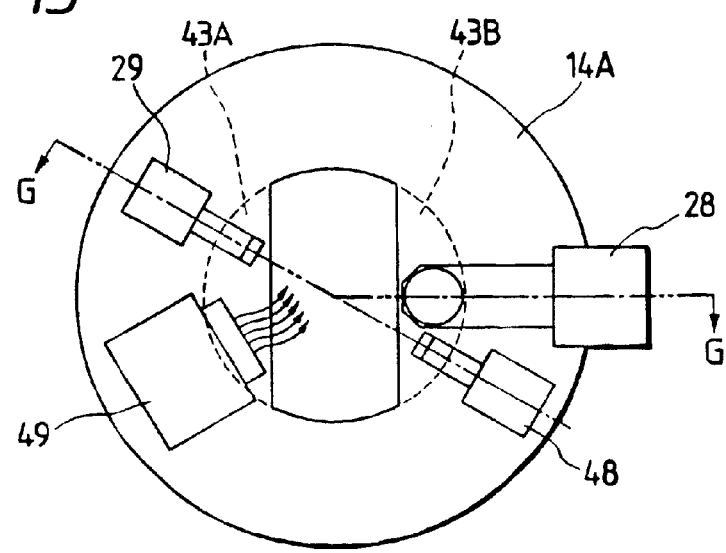
FIG. 13 is a bottom plan view of the projection optical system 14A of the projection exposure apparatus of FIG. 12.

FIG. 12 shows various mechanisms added to the projection exposure apparatus of FIG. 8 and FIG. 13 is a bottom side view of the projection optical system 14A of FIG. 12.

Figure 14:
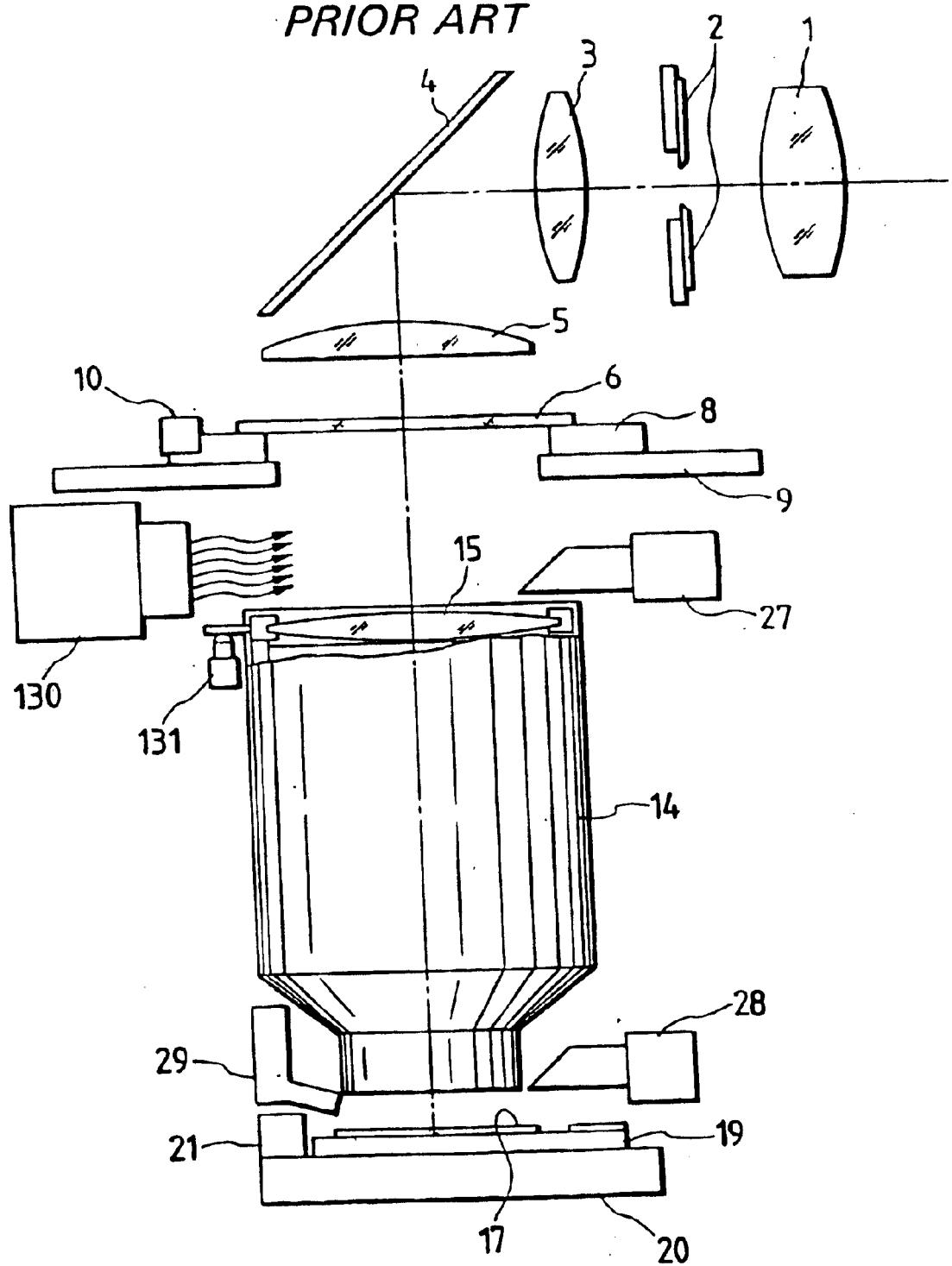
FIG. 14 is a partially broken away view showing a structure of a conventional scan type exposure apparatus.

In FIG. 12, a top end portion of a so-called through-the-lens (TTL) type alignment microscope 27 is placed in the space 42B formed to approach a metallic frame 47 for holding the lens element 15A in the projection optical system 14A at first. In the conventional structure of FIG. 14, the lens element 15 enters the optical path of the alignment system. On the other hand, in the embodiment, the lens elements 15A and the like do not intrude into the optical path of the alignment system, so that optical devices corresponding to the lens elements 15A and the like must be incorporated in advance into the optical system of the alignment microscope 27 as required. However, according to the embodiment, it is not required to place the alignment microscope 27 between the mask-side lens of the projection optical system 14A and the reticle 6.

Further, in the case where the top end portions of a plurality of the TTL type alignment microscopes 27 are placed in the space 42B or the space 42A, the distance for stepping movement between each of the microscopes at the time of alignment measurement becomes short, so that this has the advantage of improving the throughput in the processes of alignment and exposure by making the measuring time short.

In addition, instead of the alignment microscope 27, a TTL type focal position detecting system or inclined angle detecting system for leveling may be placed.

A top end portion of an off-axis type alignment microscope 28 is placed in the space 43B being one out of two spaces formed to both sides of the bottom ends of the projection optical system 14A. Since the top end portion of the off-axis type alignment microscope 28 is placed in the space 43B, i.e., the space formed at the bottom end portion of the projection optical system 14A, the distance between the optical axis of the projection optical system 14A and the optical axis of the off-axis type alignment microscope 28, i.e., called a base line, becomes shorter than that of the conventional system. Therefore, assuming that the mechanism of the projection optical system 14A has substantially the same positioning accuracy as that of the conventional one, the projection optical system 14A according to the embodiment can relatively reduce problems, such as instability of the base line caused by thermal expansion, etc. or the like.

A floodlight system 29 of an oblique incidence type focus leveling sensor is placed in the other space 43A formed at the bottom end of the projection optical system 14A. In FIG. 12, although the alignment microscope 28 and the floodlight system 29 are shown on the same plane for convenience, they are practically placed in asymmetric positions relative to the optical axis of the projection optical system 14A, as shown in the bottom side view of FIG. 13. Also, as shown in FIG. 13, a light receiving system 48 of the focus leveling sensor is arranged so as to be symmetric with respect to the floodlight system 29. The arrangement of FIG. 12 shows the projection exposure apparatus according to the embodiment as seen along the line G—G of FIG. 13.

Further, in FIG. 12, a part of a bottom surface of an air conditioning device 130 is placed in the space 42A formed near the upper end of the projection optical system 14A so as to flow clean air between the reticle and the projection optical system 14A. Correspondingly, in FIG. 13, a part of an air conditioning device 49 is placed in the space 43A formed near the bottom end of the projection optical system 14A so as to flow clean air between the photosensitive substrate and the projection optical system 14A. Particularly, the latter air conditioning device 49 can flow the air from the neighborhood of the optical paths of the focus leveling systems 29 and 48, thereby effectively reducing the fluctuation of air.

Also in FIG. 12, an actuator 131 is attached to the upper portion of the side surface of the projection optical system 14A for actuating the lens element 15A, for example, out of the lens elements of the projection optical system 14A. The position or the inclined angle of the lens element 15A is finely adjusted so as to adjust aberrations of the projection optical system 14A, thereby obtaining a desired image to be projected. Here, actuating mechanisms of lens elements other than the lens element 15A are omitted.

In the embodiment of FIGS. 12 and 13, all of the associated mechanisms, such as the alignment microscopes, the focus leveling sensors and the like, are placed in the spaces 42A, 42B, 43A and 43B so as to constitute the projection exposure apparatus. However, the present invention is not limited thereto, and various modifications can be made. For example, the top end portion of the TTL type alignment microscope 27 can be placed in the space 42A while completely leaving the air conditioning device 130 between the projection optical system 14A and the reticle 6. Any of such modifications have the advantage of being able to effectively utilize the spaces formed near the projection exposure apparatus.

Furthermore, in the embodiments mentioned above, although the description was made on the assumption that the refraction type projection optical system is used for the projection optical system 14A, it is possible to use a reflection type or a combination of reflection type and refraction type projection optical systems therefor. In such a projection optical system, it would be understood that the spaces enabling arrangement of the associated mechanisms can be formed without deteriorating the image forming property by eliminating portions, that do not contribute to the image formation, from the structural members of the projection optical system.

Furthermore, in the illumination optical system of FIG. 8, regarding the end portions 1a and 1b of the first relay lens 1 along the scan direction, the end portions 3a and 3b of the second relay lens 3 along the scan direction, and the end portions 5a and 5b of the illumination condenser lens 5 along the scan direction, etc., the luminous flux for illuminating the slit-shaped illumination area 7 does not pass therethrough. Therefore, such end portions 1a, 1b, 3a, 3b, 5a and 5b may be omitted from the members of the illumination optical system so that associated mechanisms may be arranged in the spaces corresponding to omitted portions.

According to the embodiments, since portions in the lens elements of the projection optical system, which do not contribute to the image formation on the photosensitive substrate, are eliminated, newly added spaces are created in the upper and lower sides of the projection optical system without deteriorating the image forming property. Accordingly, this has the advantage of being able to effectively arrange a part or the whole of any kind of associated mechanism, such as alignment systems or focus leveling sensors, in the newly added spaces. Also, this allows the projection optical system to be reduced in size and weight.

Further, since the off-axis type alignment optical system is placed in the space being formed near the lower end of the projection optical system, the distance between the optical axis of the projection optical system and the optical axis of the off-axis type alignment optical system, i.e., a so-called base line, becomes shorter than that of the conventional one, so that, in case of the same positioning accuracy as that of the conventional one, the projection optical system according to the invention can relatively reduce problems, such as instability of the base line caused by thermal expansion, etc. or the like.

Furthermore, when arranging optical systems (focus leveling sensors, etc.) in the spaces near the lower end of the projection optical system for detecting a state of the surface of the photosensitive substrate, the length of the optical path of the light emitted from the optical system becomes short, thereby reducing the influence of the fluctuation of air.

Furthermore, when arranging actuating mechanisms for predetermined lens elements in the spaces near the upper end of the projection optical system, the image forming property of the projection optical system can be adjusted. Similarly, when providing an air blowing mechanism for blowing a clean gas into spaces near the upper end of the projection optical system, the image forming property of the projection optical system can be stably maintained.

As mentioned above, the present invention is not limited to the foregoing embodiments and various other structures will be recognized by those skilled in the art which fall within the scope and spirit of the present invention.

What is claimed is:

1. A scan type projection exposure apparatus, comprising:
   an illumination optical system that illuminates a pattern formed on a mask with illuminating light;
   a projection optical system that forms an image of the pattern on a substrate;
   a mask stage that moves at least in one direction while holding the mask;
   a substrate stage that moves two-dimensionally while holding the substrate; and
   a control system that synchronously moves said mask stage and said substrate stage;
   said projection optical system including lens elements of which respective portions, other than areas through which image forming luminous flux of the pattern image passes, are removed.

2. A scan type projection exposure apparatus according to claim 1, wherein one of said lens elements is placed in the neighborhood of the substrate and a part of an alignment optical system is provided in a space corresponding to a respective removed portion of said one lens element so as to detect a position of a positioning mark on the substrate.

3. A scan type projection exposure apparatus according to claim 1, wherein one of said lens elements is placed in the neighborhood of the substrate and a part of an optical system is provided in a space corresponding to a respective removed portion of said one lens element so as to detect a position of the substrate relative to the optical axis of said projection optical system.

4. A scan type projection exposure apparatus according to claim 1, wherein one of said lens elements is placed in the neighborhood of the mask and an actuating device is provided in a space corresponding to a respective removed portion of said one lens element so as to adjust a position or an inclined angle of a predetermined lens element of the projection optical system.

5. A scan type projection exposure apparatus according to claim 1, wherein one of said lens elements is placed in the neighborhood of the mask and an air conditioning mechanism is provided in a space corresponding to a respective removed portion of said one lens element so as to blow a clean gas between said projection optical system and the mask.

6. A scan type projection exposure apparatus, comprising:
   an illumination optical system that forms a slit-shaped illumination area on a pattern on a mask with illuminating light;
   a projection optical system that forms an image of a portion of said pattern in said illumination area on a substrate;
   a mask stage that moves at least in one direction while holding the mask;
   a substrate stage that moves two-dimensionally while holding the substrate;
   a control system that synchronously moves said mask stage and said substrate stage; and
   an air-conditioning system including at least one of:
      an air-conditioning device for air-conditioning space in a vicinity of the mask, and having at least a part thereof provided between a mask-side lens of said projection optical system and said mask stage, at a distance less than a radius of said mask-side lens from an optical axis of said projection optical system, in an area through which illuminating light from said illumination optical system does not pass, or
      an air-conditioning device for air-conditioning a space in a vicinity of the substrate, and having at least a part thereof provided between a substrate-side lens of said projection optical system and said substrate stage, at a distance less than a radius of said substrate-side lens from the optical axis of said projection optical system, in an area through which illuminating light from said illuminating optical system does not pass.

7. A scanning exposure apparatus, comprising:
   an illumination optical system that illuminates a mask with light from a slit-like aperture;
   a projection optical system that projects a pattern image of said illuminated mask on a substrate;
   a stage system that synchronously moves said mask and said substrate relative to said projection optical system; and
   an alignment system that detects an error in alignment of said substrate with said pattern image,
   said alignment system having a portion of a component disposed between a portion of said projection optical system and one of said mask and said substrate,
   said component portion being spaced from an optical axis of said projection optical system, in a scan direction of said mask or said substrate, and disposed in an imaginary cylinder centered on said optical axis with a diameter substantially equal to a cross-dimension, in a direction perpendicular to said scan direction, of an optical element of said projection optical system that is nearest to said one of said mask and said substrate or substantially equal to a diagonal of an illumination area of said light on the optical element.

8. An apparatus according to claim 7, wherein said portion of said component is disposed between said optical element and said one of said mask and said substrate.

9. An apparatus according to claim 7, wherein said optical element is a lens element of which a portion, other than an area through which light from said illuminated mask passes, is removed.

10. An apparatus according to claim 7, wherein said alignment system irradiates a mark on said substrate with a light beam through said projection optical system and said component and includes a detector that receives a corresponding light beam from the mark to align said substrate with said pattern image in a direction perpendicular to said optical axis.

11. An apparatus according to claim 7, wherein said alignment system irradiates said substrate with a light beam through said projection optical system and said component and includes a detector that receives a corresponding light beam from said substrate to align said substrate with said pattern image in a direction along said optical axis.

12. An apparatus according to claim 11, wherein said alignment system includes a device disposed within said projection optical system so as to deflect an optical path of the light beam passing through said projection optical system.

13. An apparatus according to claim 7, wherein said alignment system irradiates said substrate with a light beam and includes a detector that receives a corresponding light beam from said substrate by way of said projection optical system and said component to align said substrate with said pattern image.

14. An apparatus according to claim 7, wherein said optical element is nearest to said substrate, said portion of said component is disposed between said optical element and said substrate, and said alignment system detects a mark on said substrate using said component, without using said projection optical system, to align said substrate with said pattern image in a direction perpendicular to said optical axis.

15. An apparatus according to claim 7, wherein said optical element is nearest to said substrate, said portion of said component is disposed between said optical element and said substrate, and said alignment system detects a position of said substrate in a direction along said optical axis using said component, without using said projection optical system.

16. An apparatus according to claim 15, further comprising:
a fluid feeding unit that feeds fluid into a space, between said projection optical system and said substrate, through which a light beam of said alignment system for detecting said position passes.

17. An apparatus according to claim 7, wherein said alignment system includes first and second optical plates, each to adjust an optical property of said projection optical system so as to align said substrate with said pattern image, and wherein when said first optical plate is disposed so as to permit light from said illuminated mask to pass through said first optical plate, said second optical plate is disposed adjacent to said first optical plate as said component.

18. An apparatus according to claim 17, wherein said alignment system includes a device holding said first and second optical plates so that said first optical plate can be exchanged with said second optical plate.

19. An apparatus according to claim 17, wherein said first and second optical plates are disposed between said mask and said projection optical system to adjust distortion of said projection optical system.

20. An apparatus according to claim 19, wherein said alignment system includes third and fourth optical plates disposed between said projection optical system and said substrate, each to adjust curvature of field of said projection optical system, and wherein when said third optical plat is disposed so as to permit light from said illuminated mask to pass through said third optical plate, said fourth optical plate is disposed adjacent to said third optical plate to constitute another component having a portion as aforesaid.

21. An apparatus according to claim 17, wherein said first and second optical plates are disposed between said projection optical system and said substrate to adjust a curvature of field of said projection optical system.

22. An apparatus according to claim 7, wherein said optical element nearest to said one of said mask and said substrate includes an edge having a radius of curvature that is substantially one-half of said cross-dimension or said diagonal.

23. A scanning exposure apparatus, comprising:
an illumination optical system that illuminates a mask with light from a slit-like aperture;
a projection optical system that projects a pattern image of the illuminated mask on a substrate;
a stage system that synchronously moves the mask and the substrate relative to the projection optical system; and
an alignment system that detects an error in an alignment of the substrate with the pattern image, said alignment system having a component disposed, at least in part, apart from an optical axis of the projection optical system in a direction parallel with respect to a scan direction of the mask or the substrate, and within an area defined by an external form of an optical element of the projection optical system on a plane perpendicular to the optical axis between the mask and the substrate, so as to prevent light from the illuminated mask from irradiating the component.

24. An apparatus according to claim 23, wherein said optical element is close to one of said mask and said substrate and said component is disposed between said optical element and said one of said mask and said substrate.

25. An apparatus according to claim 23, wherein said optical element is close to one of said mask and said substrate and is a lens element of which a portion, other than an area through which light from said illuminated mask passes, is removed.

26. An apparatus according to claim 23, wherein said alignment system irradiates a mark on said substrate with a light beam through said projection optical system and said component and includes a detector that receives a corresponding light beam from the mark to align said substrate with said pattern image in a direction perpendicular to said optical axis.

27. An apparatus according to claim 23, wherein said alignment system irradiates said substrate with a light beam through said projection optical system and said component and includes a detector that receives a corresponding light beam from said substrate to align said substrate with said pattern image in a direction along said optical axis.

28. An apparatus according to claim 27, wherein said alignment system includes a device disposed within said projection optical system so as to deflect an optical path of the light beam passing through said projection optical system.

29. An apparatus according to claim 23, wherein said alignment system irradiates said substrate with a light beam and includes a detector that receives a corresponding light beam from said substrate by way of said projection optical system and said component to align said substrate with said pattern image.

30. An apparatus according to claim 23, wherein said component is disposed between said optical element and said substrate, and said alignment system detects a mark on said substrate using said component, without using said projection optical system, to align said substrate with said pattern image in a direction perpendicular to said optical axis.

31. An apparatus according to claim 23, wherein said component is disposed between said optical element and said substrate, and said alignment system detects a position of said substrate in a direction along said optical axis using said component, without using said projection optical system.

32. An apparatus according to claim 31, further comprising:
a fluid feeding unit that feeds fluid into a space, between said projection optical system and said substrate, through which a light beam of said alignment system for detecting said position passes.

33. An apparatus according to claim 23, wherein said alignment system includes first and second optical plates, each to adjust an optical property of said projection optical system so as to align said substrate with said pattern image, and wherein when said first optical plate is disposed so as to permit light from said illuminated mask to pass through said first optical plate, said second optical plate is disposed adjacent to said first optical plate as said component.

34. An apparatus according to claim 33, wherein said alignment system includes a device holding said first and second optical plates so that said first optical plate can be exchanged with said second optical plate.

35. An apparatus according to claim 33, wherein said first and second optical plates are disposed between said mask and said projection optical system to adjust distortion of said projection optical system.

36. An apparatus according to claim 35, wherein said alignment system includes third and fourth optical plates disposed between said projection optical system and said substrate, each to adjust curvature of field of said projection optical system, and wherein when said third optical plate is disposed so as to permit light from said illuminated mask to pass through said third optical plate, said fourth optical plate is disposed adjacent to said third optical plate to constitute another component disposed as aforesaid.

37. An apparatus according to claim 33, wherein said first and second optical plates are disposed between said projection optical system and said substrate to adjust curvature of field of said projection optical system.

38. A scanning exposure apparatus, comprising:

an illumination optical system having an optical axis along which optical elements are disposed to illuminate a mask with light through the optical elements;

a projection optical system of which an optical axis is optically aligned with the optical axis of the illumination optical system to project a pattern image of the illuminated mask on a substrate; and a stage system including a mask stage, provided in a mask-side space with respect to the projection optical system, that is movable while holding the mask and a substrate stage, provided in a substrate-side space with respect to the projection optical system, that is movable while holding the substrate to synchronously move the mask and the substrate;

the projection optical system including optical elements of which at least one has a portion that is removed to be provided with a space, other than an area on which the light from the illuminated mask is irradiated.

39. An apparatus according to claim 38, wherein said at least one optical element having said removed portion is placed in the neighborhood of said mask or said substrate.

* * * * *